United States Patent
Liu et al.

(10) Patent No.: US 11,244,091 B2
(45) Date of Patent: Feb. 8, 2022

(54) MISSING SENSOR VALUE ESTIMATION

(71) Applicant: International Business Machines Corporation, Armonk, NY (US)

(72) Inventors: Liang Liu, Beijing (CN); Junmei Qu, Beijing (CN); Hong Zhou Sha, Beijing (CN); Wei Zhuang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 695 days.

(21) Appl. No.: 15/412,243

(22) Filed: Jan. 23, 2017

(65) Prior Publication Data

US 2018/0210975 A1    Jul. 26, 2018

(51) Int. Cl.
*G06F 30/20* (2020.01)
*G06N 20/00* (2019.01)
*H04L 29/08* (2006.01)

(52) U.S. Cl.
CPC ............. *G06F 30/20* (2020.01); *G06N 20/00* (2019.01); *H04L 67/12* (2013.01)

(58) Field of Classification Search
CPC ...... G06F 17/5009; G06N 20/00; H04L 67/12
See application file for complete search history.

(56) References Cited

U.S. PATENT DOCUMENTS

| | | |
|---|---|---|
| 2013/0249905 A1 | 9/2013 | Matthews et al. |
| 2014/0207493 A1 | 7/2014 | Sarrafzadeh et al. |
| 2015/0170055 A1 | 6/2015 | Beymer et al. |
| 2015/0234880 A1* | 8/2015 | Huber ...................... G06N 5/04 707/609 |

FOREIGN PATENT DOCUMENTS

WO    WO-2017111832 A1 *  6/2017  ............. G06F 17/16

OTHER PUBLICATIONS

YuanYuan Li, A spatial-temporal imputation technique for classification with missing data in a wireless sensor network, 2008 (Year: 2008).*
Zhipeng Gao, A Missing Sensor Data Estimation Algorithm Based on Temporal and Spatial Correlation, 2015 (Year: 2014).*
Dong Wang, Optimizing Quality-of-Information in Cost-sensitive Sensor Data Fusion, 2011 (Year: 2011).*
Jinjun Tang, A hybrid approach to integrate fuzzy C-means based imputation method with genetic algorithm for missing traffic volume data estimation, 2015 (Year: 2015).*
Ballari, Metadata behind the Interoperability of Wireless Sensor Networks (Year: 2009).*
Wong, Imputing Missing Values in Sensor Networks Using Sparse Data Representations (Year: 2014).*
L.Z. Wong et al., "Inputting Missing Values in Sensor Networks Using Sparse Data Representations," Proceedings of the 17th ACM International Conference on Modeling, Analysis and Simulation of Wireless and Mobile Systems (MSWiM), Sep. 21-26, 2014, pp. 227-230, Montreal, QC, Canada.

* cited by examiner

*Primary Examiner* — Abdullah Al Kawsar
*Assistant Examiner* — Tewodros E Mengistu
(74) *Attorney, Agent, or Firm* — Joseph Petrokaitis; Ryan, Mason & Lewis, LLP (57) ABSTRACT

An input data set for a model for estimating a missing value of a sensor in a sensor network is determined. The input data set includes one or more sensor readings selected according to a temporal-spatial parameter which is dynamic and specific to the sensor. Then the missing value of the sensor is estimated using the determined input data set as an input to the model.

20 Claims, 7 Drawing Sheets

MISSING SENSOR VALUE ESTIMATION

BACKGROUND

Embodiments of the present invention relate to data processing, and more specifically, to missing sensor value estimation.

A sensor network comprises a collection of sensors (nodes) configured to monitor and record data (e.g., sensor values) within an environment. For example, the sensor network may be configured to monitor physical, environmental, or other conditions within the environment. In a sensor network, an incomplete reading resulting in a missing value of a sensor may occur. This is mainly because the sensor network is especially susceptible to interference, battery depletion, hardware failures, and other potential environmental and communications issues. The missing sensor value may introduce a challenge to one or more applications utilizing the information obtained via the sensor network, such as time-sequence pattern analysis, tendency prediction, and so on.

SUMMARY

Illustrative embodiments provide for estimating a missing value of a sensor in a sensor network.

According to one embodiment, a method is provided. The method may comprise determining an input data set for a model for estimating a missing value of a sensor in a sensor network. The input data set may include one or more sensor readings selected according to a temporal-spatial parameter which is dynamic and specific to the sensor. The method may further comprise estimating the missing value of the sensor using the input data set as an input to the model. The steps are performed by at least one processing device comprising a processor operatively coupled to a memory.

According to another embodiment, a system is provided, which comprises a processor and a computer-readable memory unit coupled to the processor. The memory unit may comprise instructions that when executed by the processor perform the steps of: determining an input data set for a model for estimating a missing value of a sensor in a sensor network, wherein the input data set includes one or more sensor readings selected according to a temporal-spatial parameter which is dynamic and specific to the sensor; and estimating the missing value of the sensor using the input data set as an input to the model.

According to yet another embodiment, a computer program product is provided, which comprises a computer-readable storage medium having computer-readable program instructions embodied therewith. The program instructions are executable by a processor to cause the processor to: determine an input data set for a model for estimating a missing value of a sensor in a sensor network, wherein the input data set includes one or more sensor readings selected according to a temporal-spatial parameter which is dynamic and specific to the sensor; and estimate the missing value of the sensor using the input data set as an input to the model.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
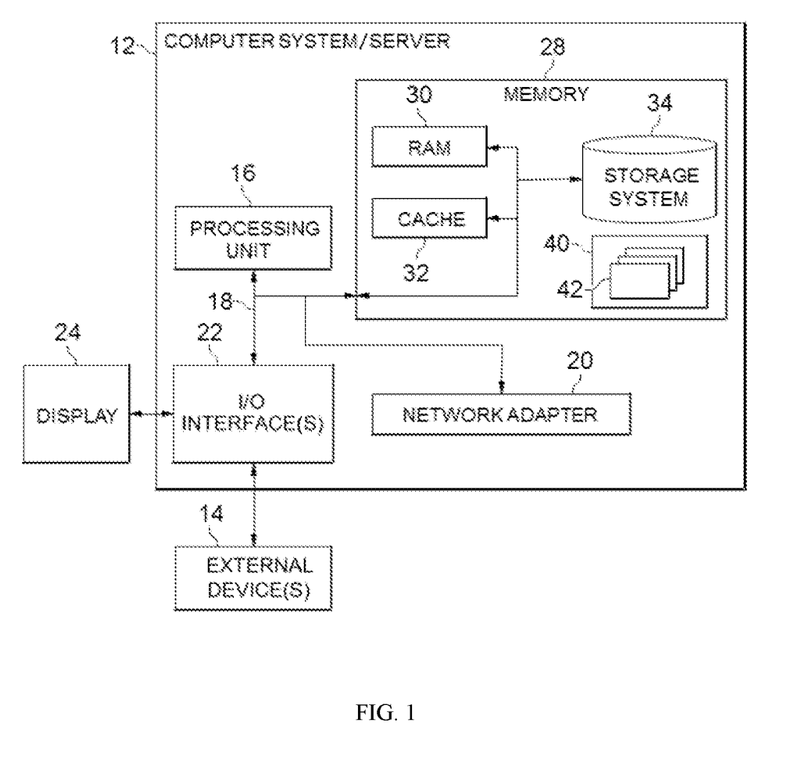
FIG. 1 shows an exemplary computer system which is applicable to implement one or more embodiments.

One or more embodiments can make use of software running on a computer or workstation. With reference to FIG. 1, an exemplary computer system/server 12 that is applicable to implement the embodiments of the present invention is shown. Computer system/server 12 is only illustrative and is not intended to suggest any limitation as to the scope of use or functionality of embodiments of the invention described herein.

Computer system/server 12 is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices. Illustrative embodiments of a cloud computing environment are described below with reference to FIGS. 7 and 8.

As shown in FIG. 1, computer system/server 12 is shown in the form of a computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Some embodiments of the present invention may be implemented as the program/utility 40 or the program modules 42 of FIG. 1, which may be at least part of the missing sensor value estimation system. Now, with reference to FIGS. 2-6, some embodiments of the present invention will be described below.

Conventional missing value imputation/estimation methods fill in missing values of sensors in a sensor network based on one or more sensor readings within a fixed temporal, spatial, or temporal-spatial range. Moreover, the range of sensor readings used for missing value estimation is usually uniform across all the sensors in the sensor network. However, using a fixed and/or uniform range for missing value estimation ignores possible environmental differences among the sensors within the sensor network, and also the environmental variation of the same sensor. Thus, using a fixed and/or uniform range for estimating a missing value may result in a decrease in accuracy of the estimation.

There is need for a method, system and computer program product for estimating a missing value of a sensor in a sensor network with an improved estimation accuracy.

In the following descriptions, the term "target sensor" refers to a sensor whose value is to be estimated. The term "input sensor reading(s)" or "input reading(s)" refers to sensor reading(s) within the temporal-spatial range defined by a temporal-spatial parameter which are used as input of the model to estimate a value for a target sensor.

Figure 2:
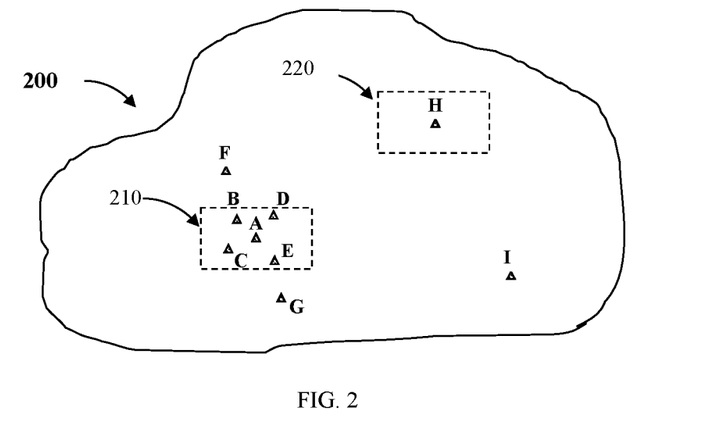
FIG. 2 shows an exemplary air quality monitoring sensor network with which one or more embodiments are implemented.

FIG. 2 shows an air quality monitoring sensor network 200 as an example of the sensor network. In FIG. 2, the solid triangles represent sensors, and nine sensors, i.e., Sensors A-I, are shown. It is to be appreciated that each triangle may also represent a monitoring site having multiple sensors in cooperation. It can be seen that the distribution of sensors in FIG. 2 is non-uniform, which is common and may be due to many factors such as geography, population density, etc.

The two broken line rectangles in FIG. 2, rectangle 210 and rectangle 220, represent two equal spatial ranges. In this illustrative example, Sensor A is located sufficiently within the center of rectangle 210, and Sensor H is located sufficiently within the center of rectangle 220. As can be seen, if sensor readings within such a spatial range are to be used to estimate a missing value of Sensor A or Sensor H, there are several spatial neighborhoods (Sensors B-E) for Sensor A, but there is no spatial neighborhood for Sensor H. If uniform spatial ranges are used for missing value estimation for Sensors A and H, the estimation accuracy might be low or even impossible for Sensor H although the accuracy for Sensor A might be satisfactory.

Figure 3A:
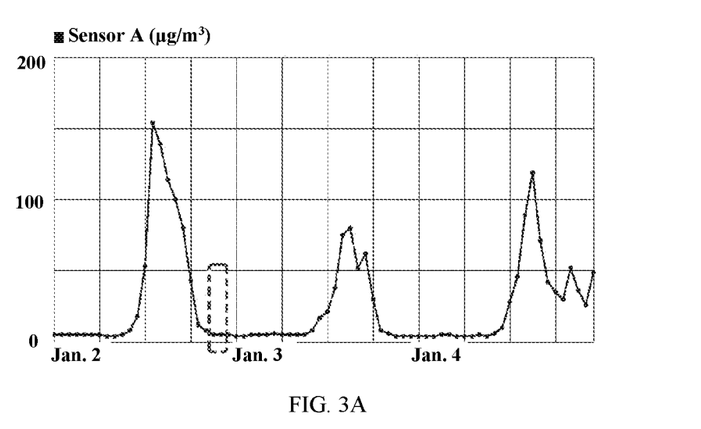
FIGS. 3A and 3B show exemplary readings from Sensor A of FIG. 2 during three consecutive days in different seasons.
Figure 3B:
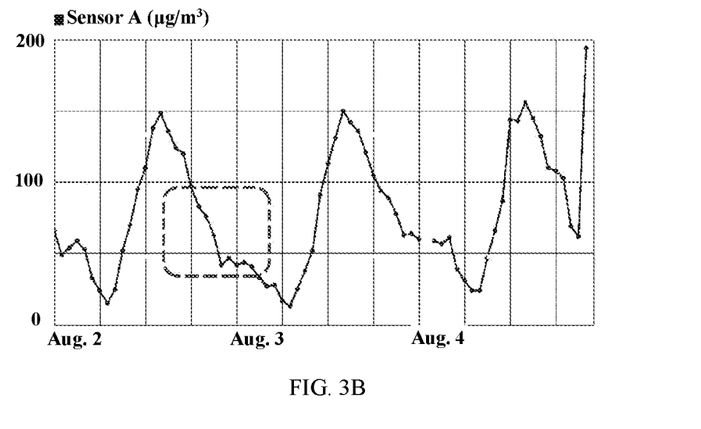

FIGS. 3A and 3B show exemplary readings from Sensor A of FIG. 2 during three consecutive days in different seasons, i.e., winter and summer, respectively.

In the graphs of FIGS. 3A and 3B, the abscissa represents dates of a year, and the ordinate represents a detected value of Particulate Matter (PM) 2.5. In particular, FIG. 3A shows Sensor A's readings from Jan. 2, 2015 to Jan. 4, 2015, where the readings are generated once per hour. FIG. 3B shows Sensor A's readings from Aug. 2, 2015 to Aug. 4, 2015, where the readings are also generated once per hour.

As can be seen, the change rate of the detected values of PM 2.5 varies among seasons. In winter, during which the change rate is low, using sensor readings within a narrow temporal range for missing value estimation may be enough for improving the estimation accuracy. While in summer, during which the change rate is high, using sensor readings within a wide temporal range for missing value estimation may be advantageous for improving the estimation accuracy. The broken line rectangles in FIGS. 3A and 3B show exemplary narrow and wide temporal ranges for estimation, respectively.

The above descriptions with respect to FIGS. 2-3 are given in the context of an air quality monitoring sensor network. But it is to be appreciated that the embodiments described herein are not limited to this context. The missing sensor value estimation according to embodiments of the invention may also be used for other sensor networks, such as a traffic sensor network, a temperature sensor network, a humidity sensor network, or the like.

From FIGS. 2-3, it can be seen that it is not satisfactory to use a fixed and uniform spatial and temporal range of input readings for missing sensor value estimation, and thus a new method with improved performance is desirable.

Figure 4:
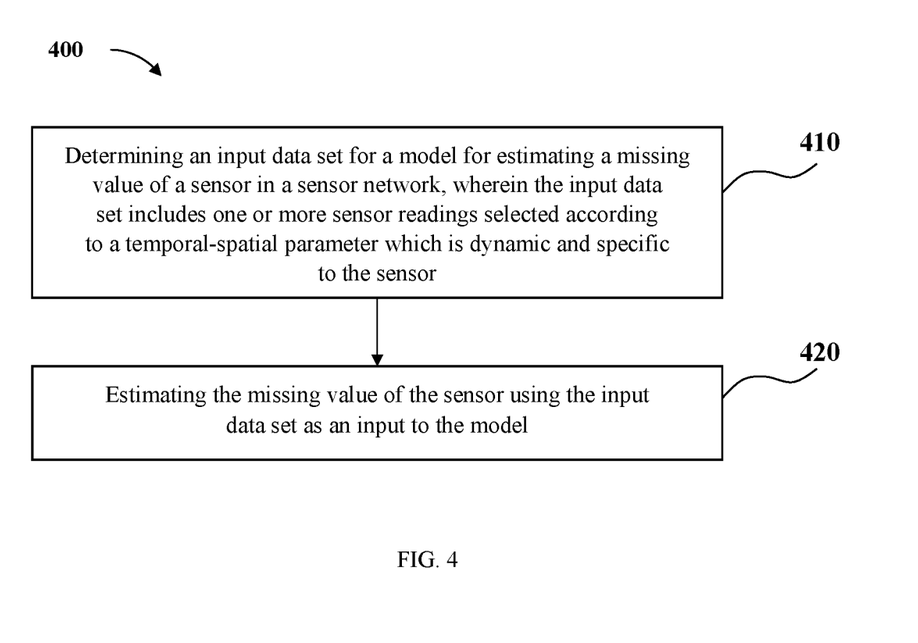
FIG. 4 is a flow chart showing an exemplary method for estimating a missing sensor value according to an embodiment.

Now refer to FIG. 4, which is a flow chart 400 showing an exemplary method according to embodiments of the present invention.

At block 410, an input data set for a model for estimating a missing value of a sensor (i.e., a target sensor) in a sensor network may be determined. The input data set may include one or more sensor readings (i.e., input readings) selected according to a temporal-spatial parameter. According to an embodiment, the temporal-spatial parameter is dynamic and specific to the target sensor.

Each sensor reading may be associated with a geographical position of the sensor and a measuring time at which the reading is generated. According to an embodiment, the input data set for the target sensor may further include geographical position information of the sensors providing the input readings and temporal information regarding the time when the input readings were generated. According to another embodiment, the geographical position information and the temporal information may be input to the model as metadata for the input readings.

According to an embodiment, the model for estimating a missing value of a target sensor in a sensor network may be a rather simple model, such as an averaging model which calculates an average of the input readings as the estimated missing value. According to another embodiment, the model may be a more complex model, such as a weighted averaging model that calculates a weighted average of the input readings as the estimated missing value. The weight for each input reading of the weighted averaging model can be determined using a variety of algorithms, such as Error Back Propagation (BP) algorithm, linear regression algorithm, or other appropriate algorithms. It should be appreciated that there is no limitation to the model used here, and any model that uses input readings to estimate a value of the target sensor can be utilized in accordance with the embodiments described herein.

According to an embodiment, the temporal-spatial parameter for the target sensor indicates a temporal-spatial range used for selecting input sensor readings for estimating missing values of the target sensor. The temporal-spatial parameters for different sensors in the same sensor network may be different from one another. Moreover, the temporal-spatial parameter for the same sensor may vary as the time elapses. The temporal-spatial parameter for a sensor may be customized according to, e.g., the particular geographical position of this sensor and/or the concerned time when the sensor value is to be estimated.

According to an embodiment, the temporal-spatial parameter may indicate at least one temporal range and at least one spatial range within which readings of sensors in the sensor network are to be included in the input data set. For example, the temporal-spatial parameter may include one or more pairs of temporal factor and spatial factor which indicate a temporal range and a spatial range, respectively. For each pair, readings of sensors in the sensor network within the temporal range and the corresponding spatial range may be included in the input data set. It would be appreciated that, the temporal-spatial parameter may be any kind of information that can indicate the temporal range(s) and spatial range(s), not limited to the actual values of time or distance.

Take Sensor A of FIG. 2 as an example. In a simple case, the temporal-spatial parameter for Sensor A may comprise a single pairing of a temporal factor and a spatial factor. For example, the temporal factor may be 1, indicating a temporal range of 1 hour backward from a current time, and the spatial factor may be 15, indicating a spatial range, e.g., a circle, with a radius of 15 miles and centered at Sensor A. In this case, if the value of Sensor A at the current time is to be estimated, the input data set for estimation will include the readings of the sensors within 15 miles from Sensor A (e.g., Sensors A, B, C, D, E, F and G) and being measured within 1 hour backward from the current time. In another case, the temporal-spatial parameter for Sensor A may comprise multiple pairings of temporal factors and spatial factors. For example, in addition to the previously-mentioned temporal factor and spatial factor pairing, another pairing may be included that comprises a temporal factor indicating a temporal range from 1 to 2 hours backward from the current time, and a spatial factor of 10 indicating a spatial range, e.g., a circle, with a radius of 10 miles and centered at Sensor A. Then, the input data set will include the readings of the sensors within 15 miles from Sensor A (e.g., Sensors A, B, C, D, E, F and G) and being measured within 1 hour backward from the current time, as well as the readings of the sensors within 10 miles from Sensor A (e.g., Sensors A, B, C, D, and E) and being measured from 1 to 2 hours backward from the current time. Note that the spatial range is not limited to a circle. It can be a square, a rectangle, a sphere, a cubic, a cone, or the like. Additionally, the target sensor may not be necessarily at the center of the spatial range.

Referring back to FIG. 4, at block 420, the missing value of the sensor may be estimated using the input data set determined at block 410 as an input to the model. For example, the above-mentioned averaging model may be employed. Then the sensor readings in the input data set are averaged to obtain the estimated missing value of the target sensor.

Now we will describe how to determine the temporal-spatial parameter used at block 410 of FIG. 4 for the target sensor.

According to an embodiment, the temporal-spatial parameter for the target sensor may be determined by optimizing the temporal-spatial parameter using one or more historical readings of the target sensor as expected (i.e., correct) outputs for validating the model. In the following descriptions, a historical reading of the target sensor used as an expected output of the model is called "an expected value", which is to be compared with a corresponding estimated value for validating the model.

The historical readings of the target sensor during a predetermined temporal range may be used as expected values. For each historical reading of target sensor, the temporal-spatial parameter may indicate a respective temporal-spatial range relative to the historical reading, and sensor readings in the temporal-spatial range may be used as the input data set for estimating the value of the target sensor corresponding to the expected value. By adjusting the temporal-spatial parameter to make the estimated values of the target sensor approximate the expected values (i.e., the actual historical readings) of the target sensor, the temporal-spatial parameter can be optimized, which can be used for future estimation of missing values of the target sensor. More detailed processes will now be described with reference to FIG. 5.

Figure 5:
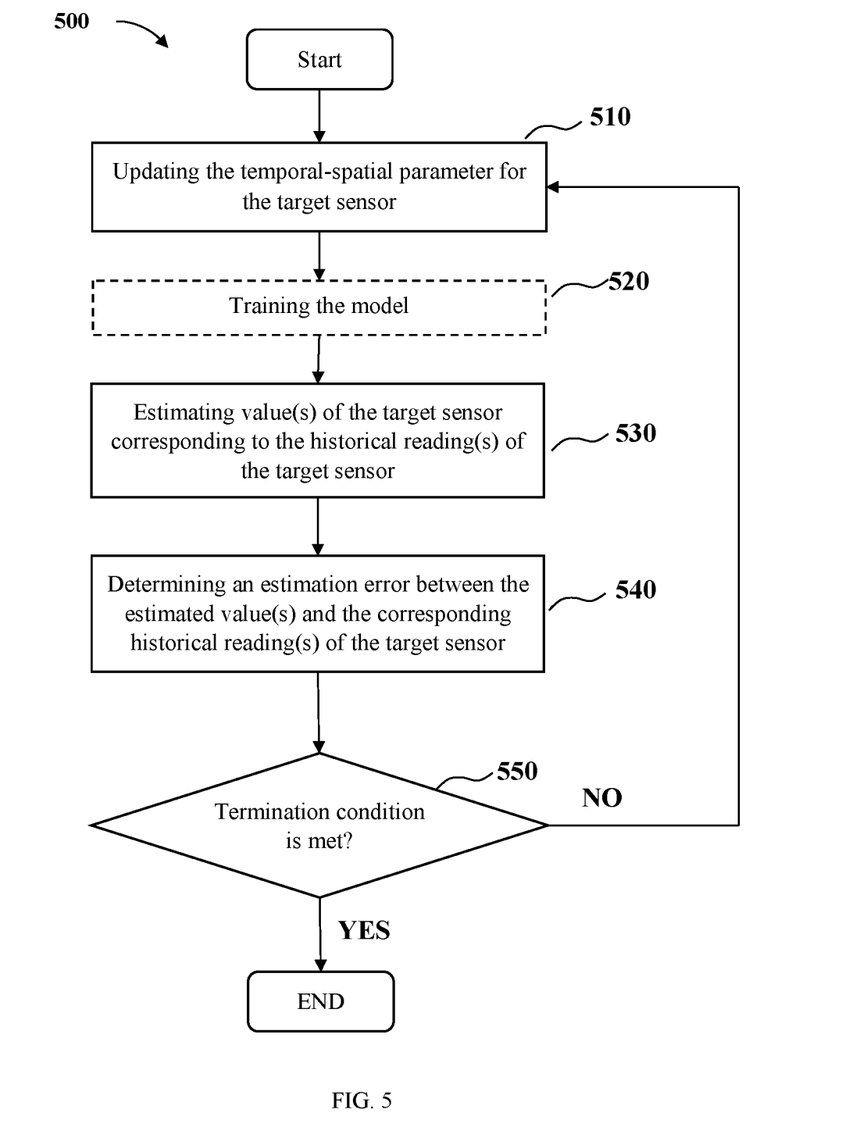
FIG. 5 is a flow chart showing an exemplary method for optimizing a temporal-spatial parameter according to an embodiment.

FIG. 5 depicts a flow chart 500 showing an exemplary method for optimizing the temporal-spatial parameter for the target sensor using one or more historical readings of the target sensor as expected values, according to embodiments of the present invention. The discussion with reference to FIG. 5 will be made using Sensor A of FIG. 2 as the target sensor. However, as can be understood, the same method can be applied to any sensor in the sensor network.

At block 510, the temporal-spatial parameter for the target sensor (e.g., Sensor A) may be updated, e.g., according to a predetermined rule. Updating the temporal-spatial parameter comprises initializing the temporal-spatial parameter in the case that there is no previous value associated with the temporal-spatial parameter, and modifying the temporal-spatial parameter from a previous value in the case that there is a previous value associated with the temporal-spatial parameter. With the temporal-spatial parameter updated, the input data set of the model will be changed.

According to an embodiment, the initial temporal-spatial parameter may indicate a short temporal range and a small spatial range, such that a small number of input sensor readings are included in the input data set for estimation. In each iteration, the temporal-spatial parameter may be modified to gradually expand the input data set. In other words, the parameter may be modified to gradually add one or more input sensor readings. More specific examples regarding the modification of temporal-spatial parameter will be described later with reference to FIGS. 6A-6B.

At block 520, the model is trained with the modified temporal-spatial parameter, if necessary. It should be noted that block 520 is not necessary for all kinds of models. For a simple model, such as an averaging model, there is no need to train the model. For a more complicated model such as a weighted averaging model, each time the temporal-spatial parameter is modified, the model can be re-trained to determine the weights. For example, for a weighted averaging model, each time the temporal-spatial parameter is modified, the number of input sensor readings in the input data set may be changed, and thus the weights for the input sensor readings may need to be re-determined. According to an embodiment, the training set used at block 520 may include the expected values and the corresponding input data sets determined by the modified temporal-spatial parameter. The training can be performed using any appropriate algorithm, such as Error Back Propagation (BP) algorithm, linear regression algorithm, etc.

Then method proceeds to validating the model using one or more historical readings of the target sensor as the expected values of the model. The validation may be performed as shown in blocks 530 and 540 in FIG. 5.

At block 530, for each of one or more expected values (i.e., historical readings for validating) of the target sensor, a corresponding input data set based on the modified temporal-spatial parameter is used to obtain the estimated value of the target sensor. According to an embodiment, for each historical reading, a value of the target sensor at the same time point as the historical reading is estimated.

For example, let us assume that the target sensor is Sensor A in FIG. 2 and Sensor A's actual reading at time T has been known, but that this reading is missing and Sensor A's value at time T is to be estimated. In other words, Sensor A's historical reading at time T is used as an expected output for validating the model. In the validation, the temporal-spatial parameter can be modified and thus the input data set for estimating the value of Sensor A at time T is changed, which leads to a change of the output of the model, i.e., the estimated value of Sensor A at time T.

In the case where a plurality of historical readings of Sensor A at different time points are used as expected values, the corresponding estimated values of Sensor A at the different time points may be obtained in a similar way. For example, the historical sensor readings may be generated at a predetermined frequency, e.g., once per hour. Then, in a 15-day duration, for each of Sensors A-I, ideally, 15×24 (=360) readings may be generated, and the readings of Sensor A may be used as expected output values for validating the model. For each of the expected values, it is assumed that the reading is missed, and the missing value will be estimated using the modified temporal-spatial parameter. Then, 360 estimated values of Sensor A at 360 discrete time points may be obtained.

At block 540, an estimation error between the estimated one or more values and the corresponding one or more historical readings (i.e., expected values) of the sensor may be determined. If there is only one expected value is used, the estimation error may be the difference between the estimated value and the expected value of the target sensor. If more expected values of the target sensor are used, the estimation error can be measured with a metric, such as the mean absolute error (MAE). The MAE is defined by $$MAE = \frac{1}{m}\sum_{i=1}^{m} |f_i - y_i|,$$

wherein $f_i$ represents the estimated value of the target sensor at a time point i, $y_i$ represents the expected value of the target sensor at the time point i, and m represents the number of the time points (i.e., the number of the historical readings of the target sensor used for the validation). In the above-mentioned example where the historical readings of Sensor A in a 15-day duration are used, m will be equal to 360, and the MAE between 360 estimated values and corresponding 360 expected values at 360 discrete time points can be calculated as the estimation error. Note that the metric for measuring the estimation error is not limited to MAE, and any other appropriate metric can be used in accordance with the embodiments described herein, such as the mean absolute scaled error (MASE), the mean squared error, etc.

Next, method proceeds to block 550. At block 550, it may be determined whether a termination condition is met. If the termination condition is not met, the process returns back to block 510 to further modify the temporal-spatial parameter in a next iteration. If the termination condition is met, then the optimized temporal-spatial parameter will be saved for future estimation of missing values for the target sensor, e.g., in the method of FIG. 4. For example, the optimized temporal-spatial parameter may be the temporal-spatial parameter which results in a minimal estimation error. Since the temporal-spatial parameter is specially optimized for the target sensor, the accuracy of missing sensor value estimation for the target sensor can be improved.

The termination condition can be preset according to the requirement or capability of the system performing the method of FIG. 5. For example, the termination condition may be that the estimation error has been minimized, or that a predetermined number of iterations has been performed. According to an embodiment, since the modified temporal-spatial parameter can change the input data set in the temporal dimension or the spatial dimension or both, the termination condition may be that the estimation error no longer decreases even if the input data set is enlarged in either the spatial dimension or the temporal dimension.

According to an embodiment, the method for optimizing the temporal-spatial parameter may be performed periodically or each time a missing value of the target sensor is to be estimated. For example, the temporal-spatial parameter may be updated using the historical readings during a predetermined time period at the beginning of a new season, and the updated temporal-spatial parameter may be used to estimate missing values in the remaining time of the season. Alternatively, the temporal-spatial parameter may be updated once a missing value of the target sensor is to be estimated. In the latter case, high estimation accuracy may be achieved at the expense of computational complexity.

Figure 6A:
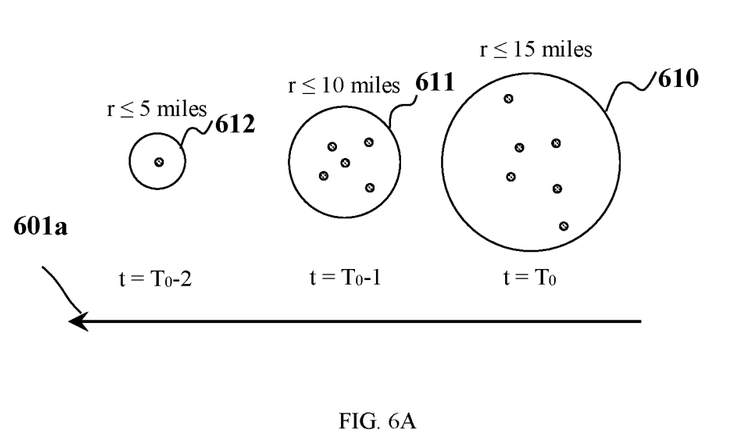
FIGS. 6A and 6B illustrate exemplary temporal ranges and spatial ranges indicated by a temporal-spatial parameter according to embodiments.
Figure 6B:
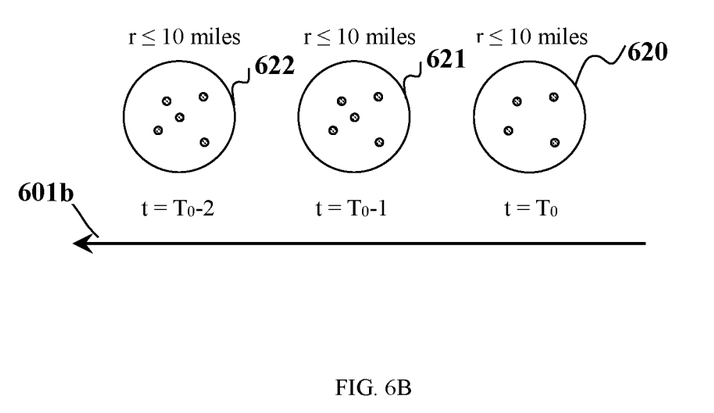

Some specific examples regarding the optimization of the temporal-spatial parameter will be described with reference to FIGS. 6A-6B. FIGS. 6A and 6B illustrate exemplary temporal ranges and spatial ranges indicated by a temporal-spatial parameter according to embodiments of the present invention. Note that FIGS. 6A-6B are merely schematic diagrams and it is to be appreciated that the diagrams may not be drawn according to actual proportions. For the purpose of simplicity, the simple averaging model is used in the examples of FIGS. 6A-6B, and thus no weights are considered in the model and block 520 in FIG. 5 (i.e., training the model) can be skipped.

As mentioned previously, in an embodiment, the temporal-spatial parameter may comprise one or more pairs of temporal factor and spatial factor, and the input data set includes readings of sensors within the temporal range and the spatial range indicated by the temporal factor and spatial factor of each pair. Specifically, the temporal-spatial parameter P may be in the form of $P=\{t_1, r_1; t_2, r_2; \ldots; t_n, r_n\}$, wherein the temporal factor $t_i$ ($1 \le i \le n$) indicates a temporal range, the spatial factor $r_i$ ($1 \le i \le n$) indicates a spatial range, and the pair ($t_i$, $r_i$) indicates a pair of corresponding temporal range and spatial range. The following descriptions will be given on the assumption that $r_i$ represents a radius value of a circle.

In FIGS. 6A and 6B, the circles 610-612 and 620-622 represent spatial ranges with Sensor A as its center. The dots within the circles represent input sensor readings and correspond to the sensors shown in FIG. 2, but the labels A-I for the sensors are omitted in FIGS. 6A and 6B. The arrow 601a in FIG. 6A and the arrow 601b in FIG. 6B represent a direction in which the time goes backward.

Moreover, the following descriptions will be given in a case where the optimized parameter P for Sensor A is determined using the historical sensor readings of Sensor A during a 15-day period as expected values to be compared with corresponding estimated values to determine the estimation error. The readings of Sensors A-I in the sensor network 200 of FIG. 2 may be used as candidates for the readings in the input data sets of the model. It is assumed that the sensor readings of Sensors A-I are generated at a predetermined frequency, for example, once per hour, such that there are 360 historical readings of Sensor A used as the expected values. The estimation error will be measured using, e.g., the MAE for all the 360 expected values. It should be noted that, although FIGS. 6A and 6B only show the input data set for one expected value at the time $T_0$, the parameter P is applied to each expected value of Sensor A to determine the respective input data set for the estimation in the validation. It should also be noted that, in this example, since Sensors A-I in the sensor network 200 synchronously generate readings at the same interval, the temporal factors $t_1$, $t_2$, and $t_3$ may indicate some discrete time points. For example, $t_1=0$, $t_2=1$, $t_3=2$ may indicate the time points at $T_0$, 1 hour before $T_0$ and 2 hours before $T_0$. However, more generally, the temporal factors $t_1$, $t_2$, and $t_3$ may indicate time intervals rather than time points.

Now an example of optimizing the temporal-spatial parameter P for Sensor A will be described with reference to FIG. 6A.

First, the parameter P is initialized to $\{0, 5\}$. That is, a pair of temporal factor and spatial factor ($t_1$, $r_1$) is set with an initial value of (0, 5). With this initial value of P, for the expected value of Sensor A at time $T_0$, the sensor readings at time $T_0$ within the radius of 5 miles from Sensor A are included the input data set for estimating the value of Sensor A at time $T_0$. For other expected values of Sensor A at other time points, the respective temporal ranges will be determined in a similar way. In this example, no other sensors than Sensor A are located within 5 miles from Sensor A, and the input data set is empty. And the iteration will continue and the parameter P will be modified.

In the second to fourth iterations, the temporal factor $t_1=0$ is fixed and the spatial factor $r_1$ increases with an increment, such as 5 miles, in order to enlarge the spatial range in the current pair. For example, $r_1$ increases from $5 \rightarrow 10 \rightarrow 15 \rightarrow 20$, with the unit of mile. For each $r_1$, the estimated value of Sensor A at time point $T_0$ will be calculated. Also, the estimated values of Sensor A at the other 359 time points will be calculated in a similar way. For example, the estimated value of Sensor A at time $T_0-1$ will be calculated using an input data set including the sensor readings at time $T_0-1$ within the radius of $r_1$ from Sensor A. The estimation error will be, e.g., the MAE for all the 360 expected values of Sensor A. In this example, when $r_1$ increases to 20 miles, the estimation error no longer decreases. Thus $\{0, 15\}$ is saved as the parameter P, and the corresponding input data set is shown by the circle 610 in FIG. 6A.

In the fifth iteration, the parameter P is modified to $\{0, 15; 1, 5\}$. That is, a new pair of temporal factor and spatial factor ($t_2$, $r_2$) is added with an initial value of (1, 5). In this way, the sensor readings at time $T_0-1$ (i.e., 1 hour before $T_0$) within the radius of 5 miles from Sensor A are added into the input data set, in addition to the existing sensor readings in the input data set, i.e., the sensor readings at time $T_0$ within the radius of 15 miles from Sensor A. In this example, the reading of Sensor A at time $T_0-1$ is added into the input data set for estimating the value of Sensor A at time $T_0$. Similar operation(s) will be performed for the other expected values of Sensor A. The estimation error will be calculated again for all the 360 expected values of Sensor A at different time points. Since the estimation error calculated with this modified parameter P decreases as compared with the previous parameter $\{0, 15\}$, the iteration continues.

In the sixth to seventh iterations, the temporal factor $t_2=1$ is fixed and the spatial factor $r_2$ increases with an increment, such as 5 miles, in order to enlarge the spatial range in the current pair. For example, $r_2$ increases from 5→40→45, with the unit of mile. When $r_2$ increases to 15 miles, the estimation error no longer decreases. Thus {0, 15; 1, 10} is saved as the parameter P, and the corresponding input data set is shown by the circles 610 and 611 in FIG. 6A.

In the eighth iteration, the parameter P is modified to {0, 15; 1, 10; 2, 5}. That is, a further new pair of temporal factor and spatial factor ($t_3$, $r_3$) is added with an initial value of (2, 5). In this way, the sensor readings at time $T_0$–2 (i.e., 2 hours before $T_0$) within the radius of 5 miles from Sensor A are added into the input data set, in addition to the existing sensor readings in the input data set, i.e., the sensor readings at time $T_0$ within the radius of 15 miles from Sensor A and at time $T_0$–1 within the radius of 10 miles from Sensor A. Since the estimation error calculated with this modified parameter P decreases as compared with the previous parameter {0, 15; 1, 10}, the iteration continues.

In the ninth iteration, the temporal factor $t_3$=2 is fixed and the spatial factor $r_3$ increases with an increment, such as 5 miles, in order to enlarge the spatial range in the current pair. For example, $r_3$ increases from 5→10, with the unit of mile. When $r_3$ increases to 10 miles, the estimation error no longer decreases. Thus {0, 15; 1, 10; 2, 5} is saved as the parameter P, and the corresponding input data set is shown by the circles 610, 611 and 612 in FIG. 6A.

In the tenth iteration, the parameter P is modified to {0, 15; 1, 10; 2, 5; 3, 5}. That is, a still further new pair of temporal factor and spatial factor ($t_3$, $r_3$) is added with an initial value of (3, 5). In this way, the sensor readings at time $T_0$–3 (i.e., 3 hours before $T_0$) within the radius of 5 miles from Sensor A are added into the input data set. Since the estimation error calculated with this modified parameter P no longer decreases, the iteration terminates.

In summary, in the above described process with reference to FIG. 6A, if the estimation error in a previous iteration decreases, the temporal range is kept unchanged and the spatial range is enlarged in the current pair; otherwise, the pair of temporal range and spatial range in the previous iteration is saved for the model and a new temporal factor and spatial factor pairing is added to the temporal-spatial parameter. Moreover, if the estimation error does not decrease in an iteration in which the new pair of temporal factor and spatial factor is added, the iteration terminates. More generally, if the input data set cannot be further enlarged in either the temporal dimension or the spatial dimension to obtain a more accurate estimation, the iteration terminates.

Thus, {0, 15; 1, 10; 2, 5} will be used as an optimized parameter P for Sensor A in future estimation. The input data set indicated by such optimized parameter P is shown in FIG. 6A.

In particular, the optimized parameter P will decide the input data set for estimating a missing value of Sensor A at a time point T. As shown in FIG. 6A, in the circle 610 with a radius value of 15 miles, there are six neighboring sensors B-G around the target Sensor A, and hence six corresponding sensor readings at time T are included in the input data set. Note that, since the reading of Sensor A at the time point T is missing and to be estimated, Sensor A's reading at the time point T will not be included in the input data set. Further, five sensor readings of sensors A-E in the circle 611 with a radius value of 10 miles at the time point T–1 are also included in the input data set. Note that Sensor A's reading at the time point T–1 exists and is included in the input data set. Furthermore, one sensor reading in the circle 612 with a radius value of 5 miles at the time point T–2 (i.e., Sensor A's reading at the time point T–2) is also included in the input data set. As shown in FIG. 6A, 6+5+1 (=12) readings in total are included in the input date set for estimating the missing value of Sensor A.

Note that, in FIG. 6A, an optimal spatial range is determined for each temporal range as an example. But there is no limitation to the modification rule of parameter P. In an alternative embodiment, the temporal factor and the spatial factor may be exchanged with each other. That is, for each spatial range, the temporal range may be elongated backward while keeping the spatial range unchanged, until an optimal temporal range is obtained. Then, a new pair of spatial factor and temporal factor may be added with an enlarged spatial range, e.g., an increased radius value.

Another example of optimizing the temporal-spatial parameter P will be described with reference to FIG. 6B. In this example, there is only one optimal temporal range and one optimal spatial range indicated by P. The parameter P may be expressed as $\{t_1, r_1\}$. In brief, the temporal range is first optimized with a fixed spatial range, and then the spatial range is optimized with the obtained optimal temporal range fixed. Alternatively, the spatial range is first optimized with a fixed temporal range, and then the temporal range is optimized with the obtained optimal spatial range fixed. A more detailed process for determining such parameter P will be described below.

First, the temporal factor $t_1$ that minimizes the estimation error for the target sensor is determined for a fixed spatial range. Assume that $r_1$=5 miles, and the temporal factor $t_1$ is gradually increased to locate the optimal temporal factor $t_1$.

In particular, in the first to fourth iterations, the spatial factor $r_1$ is fixed at 5, indicating a radius of 5 miles, while the temporal factor $t_1$ is gradually increased from 0→1→2→3, in order to gradually add input readings into the input data set. When $t_1$ increases to 3, i.e., the temporal range is 3 hours backward from the time of the value to be estimated, the estimation error no longer decreases. Thus $t_1$=2 will be saved as the temporal factor of the parameter P, which means sensor readings within 2 hours backward from the time of the value to be estimated will be included in the input data set.

Next, the spatial factor $r_1$ that minimizes the estimation error for the target sensor may be determined with the temporal factor being set as $t_1$=2.

In particular, in the fifth to sixth iterations, the temporal factor $t_1$ is fixed at 2, indicating a temporal range of 2 hours backward, while the spatial factor $r_1$ gradually increases from 5→40→45, in order to gradually add input readings. When $r_1$ increases to 15, the estimation error no longer decreases. Thus $r_1$=10 will be saved as the spatial factor of the parameter P, which means sensor readings within 10 miles from the target sensor will be included in the input data set.

Thus, {2, 10} will be saved as an optimized parameter P for the target sensor in future estimation. The input data set indicated by such optimized parameter P is shown in FIG. 6B.

In particular, the optimized parameter P will decide the input data set for estimating a missing value of the target sensor, e.g., Sensor A, at a time point T. In the example of FIG. 6B, the input data set will include all the sensor readings within 10 miles from Sensor A and 2 hours from the time point T. As shown in FIG. 6B, in the time period of 2 hours backward from time T, circles 620-622 all have a radius of 10 miles, and 4+5+5 (=14) readings in total are included in the input data set for estimating the missing value of Sensor A.

Note that, although FIG. 6B shows the optimization of P by first optimizing the temporal factor and then optimizing the spatial factor, the temporal factor and the spatial factor may be exchanged with each other in the process. That is, the spatial range is optimized first with a fixed time range, and then the temporal range is optimized with the obtained optimized spatial range. As such, a combination of an optimized spatial factor and an optimized temporal factor may be obtained as the optimized parameter P.

Usually, the optimized temporal-spatial parameter of FIG. 6A will have a higher estimation accuracy than that of FIG. 6B and is more preferable. However, considering the balance of estimation accuracy and computational complexity, FIG. 6B may be preferred in some cases.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics Are As Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 7:
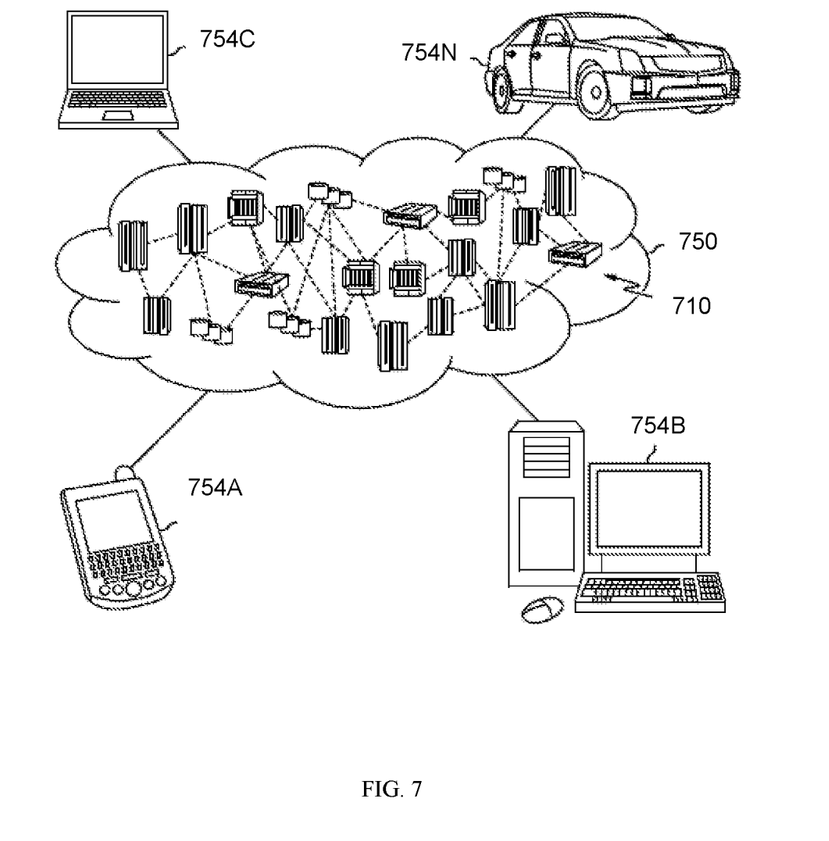
FIG. 7 depicts a cloud computing environment according to an embodiment.

Referring now to FIG. 7, illustrative cloud computing environment 750 is depicted. As shown, cloud computing environment 750 comprises one or more cloud computing nodes 710 with which local computing devices used by cloud consumers, such as, for example, personal digital assistant (PDA) or cellular telephone 754A, desktop computer 754B, laptop computer 754C, and/or automobile computer system 754N may communicate. Nodes 710 may communicate with one another. They may be grouped (not shown) physically or virtually, in one or more networks, such as Private, Community, Public, or Hybrid clouds as described hereinabove, or a combination thereof. This allows cloud computing environment 750 to offer infrastructure, platforms and/or software as services for which a cloud consumer does not need to maintain resources on a local computing device. It is understood that the types of computing devices 754A-N shown in FIG. 7 are intended to be illustrative only and that computing nodes 710 and cloud computing environment 750 can communicate with any type of computerized device over any type of network and/or network addressable connection (e.g., using a web browser).

Figure 8:
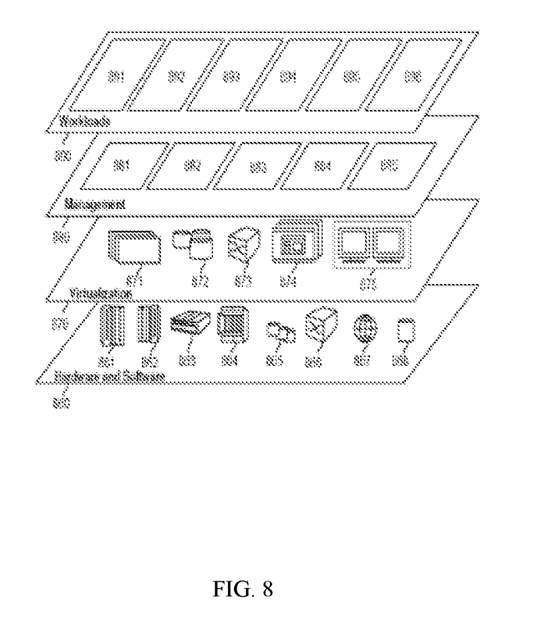
FIG. 8 depicts abstraction model layers according to an embodiment.

Referring now to FIG. 8, a set of functional abstraction layers provided by cloud computing environment 750 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 860 includes hardware and software components. Examples of hardware components include: mainframes 861; RISC (Reduced Instruction Set Computer) architecture based servers 862; servers 863; blade servers 864; storage devices 865; and networks and networking components 866. In some embodiments, software components include network application server software 867 and database software 868.

Virtualization layer 870 provides an abstraction layer from which the following examples of virtual entities may be provided: virtual servers 871; virtual storage 872; virtual networks 873, including virtual private networks; virtual applications and operating systems 874; and virtual clients 875.

In one example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Examples of workloads and functions which may be provided from this layer include: mapping and navigation 891; software development and lifecycle management 892; data capturing 893; data analytics processing 894; transaction processing 895; and sensor value estimation processing 896, which may perform one or more of the functions described above.

The present invention may be a system, a method, and/or a computer program product. The computer program product may include a computer readable storage medium (or media) having computer readable program instructions thereon for causing a processor to carry out aspects of the present invention.

According to an embodiment of the present invention, a system comprising a processor and a computer-readable memory unit coupled to the processor is provided. The memory unit may include instructions that when executed by the processor perform actions of: determining an input data set for a model for estimating a missing value of a sensor in a sensor network, wherein the input data set includes one or more sensor readings selected according to a temporal-spatial parameter which is dynamic and specific to the sensor; and estimating the missing value of the sensor using the input data set as an input to the model.

According to an embodiment of the system, the temporal-spatial parameter indicates at least one temporal range and at least one spatial range within which readings of sensors in the sensor network are to be included in the input data set.

According to an embodiment of the system, the temporal-spatial parameter for the sensor is determined by optimizing the temporal-spatial parameter using one or more historical readings of the sensor as expected outputs for validating the model.

According to an embodiment of the system, optimizing the temporal-spatial parameter comprises iteratively performing the following operations until a termination condition is met: modifying the temporal-spatial parameter; estimating one or more values of the sensor using one or more corresponding input data sets based on the modified temporal-spatial parameter; and determining an estimation error between the estimated one or more values and corresponding one or more historical readings of the sensor. The termination condition is related to the determined estimation error.

According to an embodiment of the system, optimizing the temporal-spatial parameter further comprises: each time the temporal-spatial parameter is modified, training the model before the estimating.

According to an embodiment of the system, the termination condition is met in the case that the estimation error no longer decreases even if the input data set is enlarged in either a spatial dimension or a temporal dimension.

According to an embodiment of the system, the temporal-spatial parameter comprises one or more temporal factor and spatial factor pairings and the input data set includes readings of sensors in the sensor network within a temporal range and a spatial range indicated by the temporal factor and the spatial factor of each pairing. Modifying the temporal-spatial parameter comprises one of: if the estimation error in a previous iteration decreases, keeping the temporal range unchanged and enlarging the spatial range in a current pair; otherwise, saving the pair of temporal range and spatial range in the previous iteration for the model and adding a new pair of temporal factor and spatial factor; or, if the estimation error in a previous iteration decreases, keeping the spatial range unchanged and enlarging the temporal range in a current pair; otherwise, saving the pair of temporal range and spatial range in the previous iteration for the model and adding a new pair of temporal factor and spatial factor.

According to an embodiment of the system, the termination condition is met if the estimation error does not decrease in an iteration in which the new pair of temporal factor and spatial factor is added.

According to another embodiment of the present invention, there is provided a computer program product comprising a computer readable storage medium having program instructions embodied therewith. The program instructions may be executable by a processor to cause the processor to determine an input data set for a model for estimating a missing value of a sensor in a sensor network, wherein the input data set includes one or more sensor readings selected according to a temporal-spatial parameter which is dynamic and specific to the sensor; and estimate the missing value of the sensor using the input data set as an input to the model.

According to an embodiment of the computer program product, the temporal-spatial parameter indicates at least one temporal range and at least one spatial range within which readings of sensors in the sensor network are to be included in the input data set.

According to an embodiment of the computer program product, the temporal-spatial parameter for the sensor is determined by optimizing the temporal-spatial parameter using one or more historical readings of the sensor as expected outputs for validating the model.

According to an embodiment of the computer program product, optimizing the temporal-spatial parameter comprises iteratively performing the following operations until a termination condition is met: modifying the temporal-spatial parameter; estimating one or more values of the sensor using one or more corresponding input data sets based on the modified temporal-spatial parameter; and determining an estimation error between the estimated one or more values and corresponding one or more historical readings of the sensor. The termination condition is related to the determined estimation error.

According to an embodiment of the computer program product, optimizing the temporal-spatial parameter further comprises: each time the temporal-spatial parameter is modified, training the model before the estimating.

According to an embodiment of the computer program product, the termination condition is met in the case that the estimation error no longer decreases even if the input data set is enlarged in either a spatial dimension or a temporal dimension.

According to an embodiment of the computer program product, the temporal-spatial parameter comprises one or more pairs of temporal factor and spatial factor, and the input data set includes readings of sensors in the sensor network within a temporal range and a spatial range indicated by the temporal factor and the spatial factor of each pair. Modifying the temporal-spatial parameter comprises one of: if the estimation error in a previous iteration decreases, keeping the temporal range unchanged and enlarging the spatial range in a current pair; otherwise, saving the pair of temporal range and spatial range in the previous iteration for the model and adding a new pair of temporal factor and spatial factor; or, if the estimation error in a previous iteration decreases, keeping the spatial range unchanged and enlarging the temporal range in a current pair; otherwise, saving the pair of temporal range and spatial range in the previous iteration for the model and adding a new pair of temporal factor and spatial factor.

According to an embodiment of the computer program product, the termination condition is met if the estimation error does not decrease in an iteration in which the new pair of temporal factor and spatial factor is added.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   determining an input data set for a model for estimating a missing value of a sensor in a sensor network comprising a plurality of sensors, wherein a distribution of the plurality of sensors is non-uniform, wherein the input data set includes one or more sensor readings selected according to a temporal-spatial parameter which is dynamic and specific to the sensor, wherein the temporal-spatial parameter includes one or more pairs of a temporal factor and a spatial factor which indicates a temporal range and a spatial range, respectively, wherein the sensor reading is associated with a geographical position of the sensor and a measuring time at which the reading is generated; and
   estimating the missing value of the sensor using the input data set as an input to the model,
   wherein the model is a weighted averaging model that calculates a weighted average of the input data set;
   wherein the temporal-spatial parameter for the sensor is determined by optimizing the temporal-spatial parameter using one or more historical readings of the sensor as expected outputs for validating the model,
   wherein the temporal range is based in part on the geographical position of the sensor and the measuring time comprises one or more seasons of the one or more sensor readings and the temporal-spatial parameter is updated using the one or more historical readings during a predetermined time period at the beginning of a new season, and the updated temporal-spatial parameter is utilized to estimate missing values in a remaining time of the season;
   wherein optimizing the temporal-spatial parameter comprises iteratively performing a set of optimization operations, and wherein performing the set of optimization operations comprises:
     modifying the temporal-spatial parameter for each iteration;
     training the model;
     estimating one or more values of the sensor using one or more corresponding input data sets based on the modified temporal-spatial parameter; and
     determining an estimation error between the estimated one or more values and corresponding one or more historical readings of the sensor;
   wherein modifying the temporal-spatial parameter comprises:
     if the estimation error in a previous iteration decreases, keeping one of (i) the temporal range unchanged and enlarging the spatial range in a current pair, and (ii) the spatial range unchanged and enlarging the temporal range in a current pair; otherwise, saving the pair of temporal range and spatial range in the previous iteration for the model and adding a new pair of temporal factor and spatial factor;
   wherein the set of optimization operations is iteratively performed until a termination condition is met;
   wherein the termination condition is related to the determined estimation error, the termination condition being met when the estimation error no longer decreases and the input data set is enlarged in either a spatial dimension or a temporal dimension; and
   wherein the steps are performed by at least one processing device comprising a processor operatively coupled to a memory.

2. The method of claim 1, wherein the temporal-spatial parameter indicates at least one temporal range and at least one spatial range within which readings of sensors in the sensor network are to be included in the input data set.

3. The method of claim 1, wherein the termination condition is met in the case that the estimation error no longer decreases.

4. The method of claim 1, wherein the temporal-spatial parameter comprises one or more temporal factor and spatial factor pairings, wherein the input data set includes readings of sensors in the sensor network within a temporal range and a spatial range indicated by the temporal factor and the spatial factor of each pairing, and
   wherein modifying the temporal-spatial parameter comprises one of enlarging the temporal range in a current temporal factor and spatial factor pairing, enlarging the spatial range in the current temporal factor and spatial factor pairing or adding a new temporal factor and spatial factor pairing.

5. The method of claim 4, wherein the termination condition is met if the estimation error does not decrease in an iteration in which the new pair of temporal factor and spatial factor is added.

6. The method of claim 1, wherein the model is a weighted-averaging model, and training the model comprises re-determining weights for the input sensor readings based on the expanded input data set.

7. The method of claim 1, wherein the input data set for a target sensor comprises geographical position information of the sensors providing the input readings and temporal information regarding a time when the input readings were generated.

8. The method of claim 7, wherein the geographical position information and the temporal information are input to the model as metadata for the input readings.

9. A system, comprising:
a processor; and
a computer-readable memory unit coupled to the processor, the memory unit comprising instructions that when executed by the processor perform the steps of:
determining an input data set for a model for estimating a missing value of a sensor in a sensor network comprising a plurality of sensors, wherein a distribution of the plurality of sensors is non-uniform, wherein the input data set includes one or more sensor readings selected according to a temporal-spatial parameter which is dynamic and specific to the sensor, wherein the temporal-spatial parameter includes one or more pairs of a temporal factor and a spatial factor which indicates a temporal range and a spatial range, respectively, wherein the sensor reading is associated with a geographical position of the sensor and a measuring time at which the reading is generated; and
estimating the missing value of the sensor using the input data set as an input to the model,
wherein the model is a weighted averaging model that calculates a weighted average of the input data set;
wherein the temporal-spatial parameter for the sensor is determined by optimizing the temporal-spatial parameter using one or more historical readings of the sensor as expected outputs for validating the model,
wherein the temporal range is based in part on the geographical position of the sensor and the measuring time comprises one or more seasons of the one or more sensor readings and the temporal-spatial parameter is updated using the one or more historical readings during a predetermined time period at the beginning of a new season, and the updated temporal-spatial parameter is utilized to estimate missing values in a remaining time of the season;
wherein optimizing the temporal-spatial parameter comprises iteratively performing a set of optimization operations, and wherein performing the set of optimization operations comprises:
modifying the temporal-spatial parameter for each iteration;
training the model;
estimating one or more values of the sensor using one or more corresponding input data sets based on the modified temporal-spatial parameter; and
determining an estimation error between the estimated one or more values and corresponding one or more historical readings of the sensor;

wherein modifying the temporal-spatial parameter comprises:
if the estimation error in a previous iteration decreases, keeping one of (i) the temporal range unchanged and enlarging the spatial range in a current pair, and (ii) the spatial range unchanged and enlarging the temporal range in a current pair; otherwise, saving the pair of temporal range and spatial range in the previous iteration for the model and adding a new pair of temporal factor and spatial factor;
wherein the set of optimization operations is iteratively performed until a termination condition is met; and
wherein the termination condition is related to the determined estimation error, the termination condition being met when the estimation error no longer decreases and the input data set is enlarged in either a spatial dimension or a temporal dimension.

10. The system of claim 9, wherein the temporal-spatial parameter indicates at least one temporal range and at least one spatial range within which readings of sensors in the sensor network are to be included in the input data set.

11. The system of claim 9, wherein the temporal-spatial parameter comprises one or more temporal factor and spatial factor pairings, wherein the input data set includes readings of sensors in the sensor network within a temporal range and a spatial range indicated by the temporal factor and the spatial factor of each pairing, and wherein modifying the temporal-spatial parameter comprises one of enlarging the temporal range in a current temporal factor and spatial factor pairing, enlarging the spatial range in the current temporal factor and spatial factor pairing or adding a new temporal factor and spatial factor pairing.

12. The system of claim 11, wherein the termination condition is met if the estimation error does not decrease in an iteration in which the new pair of temporal factor and spatial factor is added.

13. The system of claim 9, wherein the model is a weighted-averaging model, and training the model comprises re-determining weights for the input sensor readings based on the expanded input data set.

14. The system of claim 9, wherein the input data set for a target sensor comprises geographical position information of the sensors providing the input readings and temporal information regarding a time when the input readings were generated.

15. A computer program product comprising a computer-readable storage medium having computer-readable program instructions embodied therewith, the program instructions executable by a processor to cause the processor to:
determine an input data set for a model for estimating a missing value of a sensor in a sensor network comprising a plurality of sensors, wherein a distribution of the plurality of sensors is non-uniform, wherein the input data set includes one or more sensor readings selected according to a temporal-spatial parameter which is dynamic and specific to the sensor, wherein the temporal-spatial parameter includes one or more pairs of a temporal factor and a spatial factor which indicates a temporal range and a spatial range, respectively, wherein the sensor reading is associated with a geographical position of the sensor and a measuring time at which the reading is generated; and
estimate the missing value of the sensor using the input data set as an input to the model,
wherein the model is a weighted averaging model that calculates a weighted average of the input data set;

wherein the temporal-spatial parameter for the sensor is determined by optimizing the temporal-spatial parameter using one or more historical readings of the sensor as expected outputs for validating the model, wherein the temporal range is based in part on the geographical position of the sensor and the measuring time comprises one or more seasons of the one or more sensor readings and the temporal-spatial parameter is updated using the one or more historical readings during a predetermined time period at the beginning of a new season, and the updated temporal-spatial parameter is utilized to estimate missing values in a remaining time of the season;

wherein optimizing the temporal-spatial parameter comprises iteratively performing a set of optimization operations, and wherein performing the set of optimization operations comprises:

modifying the temporal-spatial parameter for each iteration;

training the model;

estimating one or more values of the sensor using one or more corresponding input data sets based on the modified temporal-spatial parameter; and determining an estimation error between the estimated one or more values and corresponding one or more historical readings of the sensor;

wherein modifying the temporal-spatial parameter comprises:

if the estimation error in a previous iteration decreases, keeping one of (i) the temporal range unchanged and enlarging the spatial range in a current pair, and (ii) the spatial range unchanged and enlarging the temporal range in a current pair; otherwise, saving the pair of temporal range and spatial range in the previous iteration for the model and adding a new pair of temporal factor and spatial factor;

wherein the set of optimization operations is iteratively performed until a termination condition is met; and wherein the termination condition is related to the determined estimation error, the termination condition being met when the estimation error no longer decreases and the input data set is enlarged in either a spatial dimension or a temporal dimension.

16. The computer program product of claim 15, wherein the temporal-spatial parameter indicates at least one temporal range and at least one spatial range within which readings of sensors in the sensor network are to be included in the input data set.

17. The computer program product of claim 15, wherein the temporal-spatial parameter comprises one or more temporal factor and spatial factor pairings, wherein the input data set includes readings of sensors in the sensor network within a temporal range and a spatial range indicated by the temporal factor and the spatial factor of each pairing, and wherein modifying the temporal-spatial parameter comprises one of enlarging the temporal range in a current temporal factor and spatial factor pairing, enlarging the spatial range in the current temporal factor and spatial factor pairing or adding a new temporal factor and spatial factor pairing.

18. The computer program product of claim 17, wherein the termination condition is met if the estimation error does not decrease in an iteration in which the new pair of temporal factor and spatial factor is added.

19. The computer program product of claim 15, wherein the model is a weighted-averaging model, and training the model comprises re-determining weights for the input sensor readings based on the expanded input data set.

20. The computer program product of claim 15, wherein the input data set for a target sensor comprises geographical position information of the sensors providing the input readings and temporal information regarding a time when the input readings were generated.

* * * * *